United States Patent
Wan (10) Patent No.: US 9,148,112 B2
(45) Date of Patent: Sep. 29, 2015

(54) MATCHING CIRCUIT SYSTEM

(71) Applicant: RichWave Technology Corp., Taipei (TW)

(72) Inventor: Kuang-Lieh Wan, Taipei (TW)

(73) Assignee: RichWave Technology Corp., NeiHu District, Taipei (TW)

( * ) Notice: Subject to any disclaimer, the term of this patent is extended or adjusted under 35 U.S.C. 154(b) by 227 days.

(21) Appl. No.: 13/742,363

(22) Filed: Jan. 16, 2013

(65) Prior Publication Data

US 2013/0181788 A1    Jul. 18, 2013

(30) Foreign Application Priority Data

Jan. 17, 2012    (TW) .............................. 101101803 A (51) Int. Cl.
    *H03H 7/38*         (2006.01)
(52) U.S. Cl.
    CPC ....................................... *H03H 7/38* (2013.01)
(58) Field of Classification Search
    CPC ....................................................... H03H 7/38
    USPC .......................................................... 333/32
    See application file for complete search history.

(56) References Cited

U.S. PATENT DOCUMENTS

| | | | | |
|---|---|---|---|---|
| 5,146,178 | A * | 9/1992 | Nojima et al. ................. | 330/251 |
| 5,347,229 | A * | 9/1994 | Suckling et al. .............. | 330/251 |
| 2008/0079514 | A1* | 4/2008 | Prikhodko et al. ............ | 333/175 |
| 2008/0119214 | A1* | 5/2008 | Liu et al. ....................... | 455/522 |
| 2010/0201456 | A1* | 8/2010 | Onno et al. .................... | 333/32 |
| 2010/0308933 | A1* | 12/2010 | See et al. ........................ | 333/32 |

FOREIGN PATENT DOCUMENTS

| | | |
|---|---|---|
| CN | 1667969 A | 9/2005 |
| CN | 201726362 U | 1/2011 |
| JP | 2004242269 | 8/2004 |

OTHER PUBLICATIONS

Kok, C.L.; Mustaffa, M.T.; Noh, N.M.; Manaf, A.A.; Sidek, O., "A Switchable CMOS LNA using Capacitor Switching", Computer Applications and Industrial Electronics (ICCAIE), 2011 IEEE, pp. 117-120, Dec. 4-7, 2011.

Datta, S.; Datta, K.; Dutta, A; Bhattacharyya, T.K., A Concurrent Low-Area Dual Band 0.9/2.4 GHz LNA in 0.13μm RF CMOS Technology for Multi-Band Wireless Receiver, Circuits and Systems (APCCAS), 2010 IEEE, pp. 280-283, Dec. 6-9, 2010.

(Continued)

*Primary Examiner* — Stephen E Jones
(74) *Attorney, Agent, or Firm* — Winston Hsu; Scott Margo (57) ABSTRACT

A matching circuit system includes a first inductor, a first capacitor, a second inductor, a second capacitor, a third inductor, and a third capacitor. The first inductor has a first terminal and a second terminal. The first capacitor has a first terminal coupled to the first terminal of the first inductor, and a second terminal. The second inductor has a first terminal coupled to the second terminal of the first capacitor, and a second terminal coupled to ground. The second capacitor has a first terminal coupled to the first terminal of the first capacitor, and a second terminal. The third capacitor has a first terminal coupled to the second terminal of the second capacitor, and a second terminal. The third inductor has a first terminal coupled to the first terminal of the second capacitor, and a second terminal coupled to the second terminal of the second capacitor.

21 Claims, 9 Drawing Sheets

(56) References Cited

OTHER PUBLICATIONS

Chin-Yuan Kao; Yueh-Ting Chiang; Jeng-Rern Yang, "A Concurrent Multi-Band Low-Noise Amplifier for WLAN/WiMAX Applications", Electro/Information Technology, 2008. EIT, 2008 IEEE, pp. 514-517, May 18-20, 2008.

Dal Ahn; Jun-Seok Park; Chul-Soo Kim; Juno Kim; Yongxi Qian; Itoh, T., "A Design of the Low-Pass Filter Using the Novel Microstrip Defected Ground Structure", IEEE Transactions on Microwave Theory and Techniques, vol. 49, No. 1, pp. 86-93, Jan. 2001.

Datta, S.; Datta, K.; Dutta, A; Bhattacharyya, T.K., "Fully Concurrent Dual-Band LNA Operating in 900 MHz/2.4 GHz Bands for Multi-Standard Wireless Receiver with sub-2dB Noise Figure", (ICETET), 2010 IEEE, 3rd International Conference on Emerging Trends in Engineering and Technology, pp. 731-734, Nov. 19-21, 2010.

\* cited by examiner

MATCHING CIRCUIT SYSTEM

BACKGROUND OF THE INVENTION

1. Field of the Invention

The present invention relates to a matching circuit system, and particularly to a matching circuit system that can utilize combinations of a plurality of inductors and a plurality of capacitors to suppress a second harmonic and a third harmonic of an input signal of an input stage circuit and match an input impedance of the input stage circuit.

2. Description of the Prior Art

Figure 1:
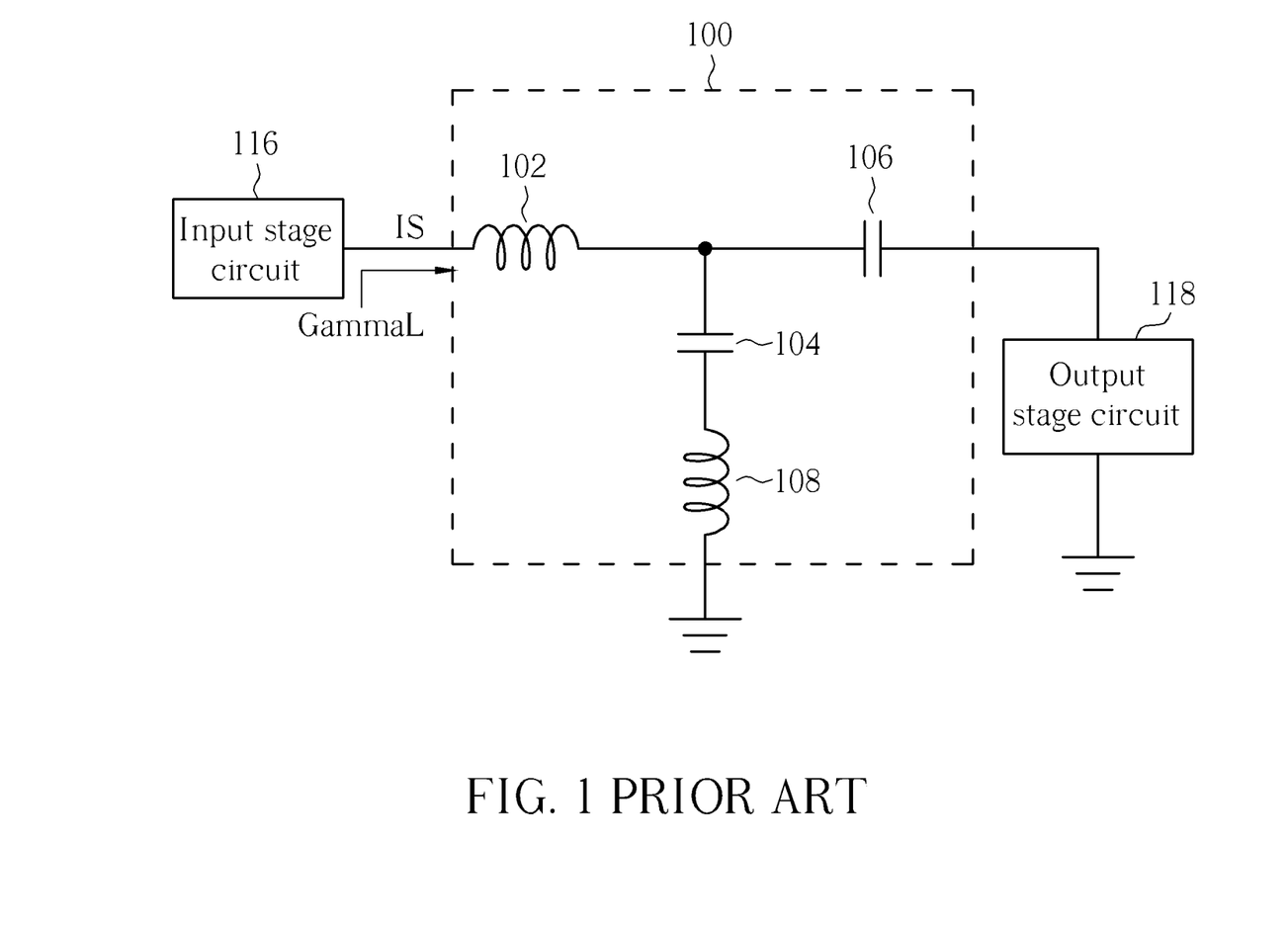
FIG. 1 is a diagram illustrating a matching circuit according to the prior art.

Please refer to FIG. 1. FIG. 1 is a diagram illustrating a matching circuit 100 according to the prior art. The matching circuit 100 includes a first inductor 102, a first capacitor 104, a second capacitor 106, and a second inductor 108. The first inductor 102 and the first capacitor 104 are used for matching an input impedance GammaL of an input stage circuit 116 (such as a power amplifier or an amplifier), and forming a low-pass filter to filter a high frequency component of an input signal IS of the input stage circuit 116. The second capacitor 106 is used for blocking a direct current component of the input signal IS of the input stage circuit 116.

Although power of the input signal IS can be transmitted to an output stage circuit 118 (such as an antenna, a switch, or a next stage circuit) having a 50Ω impedance through the matching circuit 100, the matching circuit 100 cannot significantly suppress a second harmonic and a third harmonic of the input signal IS, resulting in a signal received by the output stage circuit 118 having serious harmonic distortion. Therefore, in the prior art, the signal received by the output stage circuit 118 may not match a communication specification of the Federal Communications Commission (FCC).

SUMMARY OF THE INVENTION

An embodiment provides a matching circuit system. The matching circuit system includes a first inductor, a first capacitor, a second inductor, a second capacitor, a third inductor, and a third capacitor. The first inductor has a first terminal. The first capacitor has a first terminal coupled to the second terminal of the first inductor, and a second terminal. The second inductor has a first terminal coupled to the second terminal of the first capacitor, and a second terminal coupled to ground. The second capacitor has a first terminal coupled to the first terminal of the first capacitor, and a second terminal. The third capacitor has a first terminal coupled to the second terminal of the second capacitor. The third inductor has a first terminal coupled to the first terminal of the second capacitor, and a second terminal coupled to the second terminal of the second capacitor.

Another embodiment provides a matching circuit system. The matching circuit system includes a first matching unit, a second matching unit, and a third matching unit. The first matching unit includes a first inductor, where the first inductor has a first terminal. The second matching unit is coupled between the first matching unit and ground, where the second matching unit includes a first capacitor and a second inductor. The first capacitor has a first terminal coupled to the first terminal of the first inductor, and a second terminal. The second inductor has a first terminal coupled to the second terminal of the first capacitor, and a second terminal coupled to the ground. The third matching unit is coupled between the second matching unit and the first matching unit, where the third matching unit includes a second capacitor and a third inductor. The second capacitor has a first terminal coupled to the first terminal of the first capacitor, and a second terminal. The third inductor has a first terminal coupled to the first terminal of the second capacitor, and a second terminal coupled to the second terminal of the second capacitor.

The present invention provides a matching circuit system. The matching circuit system utilizes a first capacitor and a second inductor of a second matching unit to partially suppress a second harmonic and a third harmonic of an input signal, and utilizes a first inductor of a first matching unit and the first capacitor of the second matching unit to match an input impedance of an input stage circuit and filter a high frequency component of the input signal. Then, the matching circuit system utilizes a second capacitor and a third inductor of a third matching unit, and a fourth capacitor and the first inductor of the first matching unit to suppress the second harmonic and the third harmonic of the input signal. Thus, compared to the prior art, a signal received by an output stage circuit has smaller harmonic distortion.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
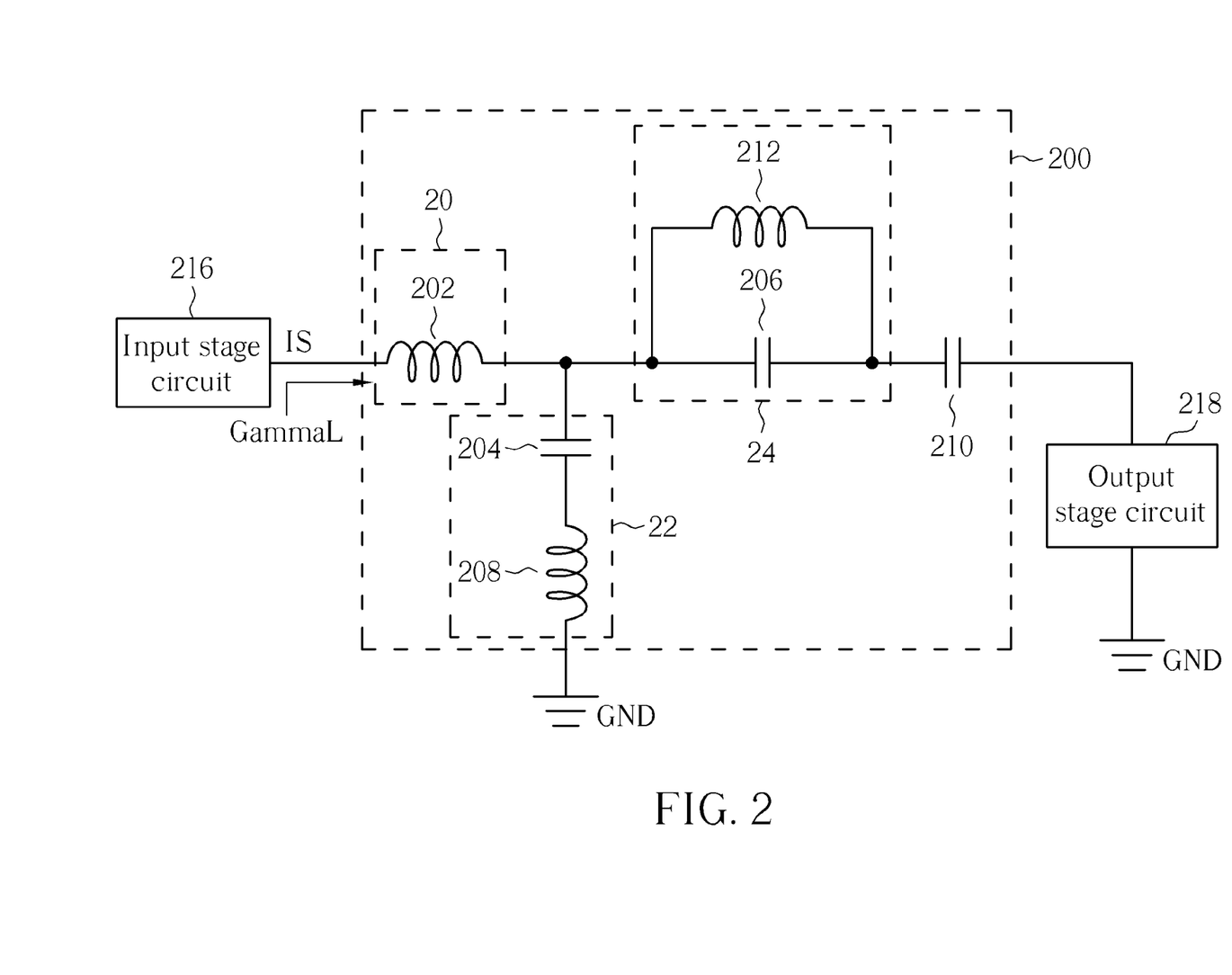
FIG. 2 is a diagram illustrating a matching circuit system according to an embodiment.

Please refer to FIG. 2. FIG. 2 is a diagram illustrating a matching circuit system 200 according to an embodiment. The matching circuit system 200 includes a first matching unit 20, a second matching unit 22, and a third matching unit 24, where the second matching unit 22 is coupled between the first matching unit 20 and ground GND. The third matching unit 24 is coupled to the second matching unit 22 and the first matching unit 20. As shown in FIG. 2, the first matching unit 20 includes a first inductor 202; the second matching unit 22 includes a first capacitor 204, and a second inductor 208, and the third matching unit 24 includes a second capacitor 206, and a third inductor 212, where the second matching unit 22 is used for generating a first open circuit resonance FOH (6 GHz), and the third matching unit 24 is used for generating a second open circuit resonance SOH (5 GHz or 7.5 GHz). In addition, the matching circuit system 200 further includes a third capacitor 210. As shown in FIG. 2, the first inductor 202 has a first terminal, and a second terminal, where the second terminal of the first inductor 202 is coupled to an input stage circuit 216. The input stage circuit 216 can be a power amplifier or an amplifier. The first capacitor 204 has a first terminal coupled to the first terminal of the first inductor 202, and a second terminal. The second inductor 208 has a first terminal coupled to the second terminal of the first capacitor 204, and a second terminal coupled to the ground GND. The second capacitor 206 has a first terminal coupled to the first terminal of the first capacitor 204, and a second terminal, where the second capacitor 206 is independent of an operation frequency of the input stage circuit 216. The third capacitor 210 has a first terminal coupled to the second terminal of the second capacitor 206, and a second terminal for being coupled to an output stage circuit 218. The third capacitor 210 is also independent of the operation frequency of the input stage circuit 216, and is used for blocking a direct current component of an input signal IS. In addition, the output stage circuit 218 can be an antenna having a 50Ω impedance, a switch having a 50Ω impedance, or a next stage circuit having a 50Ω impedance. The third inductor 212 has a first terminal coupled to the first terminal of the second capacitor 206, and a second terminal coupled to the second terminal of the second capacitor 206, where loss caused by the third inductor 212 is very small. In addition, inductances of the first inductor 202 and the third inductor 212 are related to the operation frequency of the input stage circuit 216. In addition, in another embodiment in FIG. 2, the matching circuit system 200 further includes the input stage circuit 216. In addition, in another embodiment in FIG. 2, the matching circuit system 200 further includes the input stage circuit 216 and the output stage circuit 218. In addition, the present invention is not limited to the first matching unit 20 including the first inductor 202, the second matching unit 22 including the first capacitor 204 and the second inductor 208, and the third matching unit 24 including the second capacitor 206 and the third inductor 212.

Figure 3:
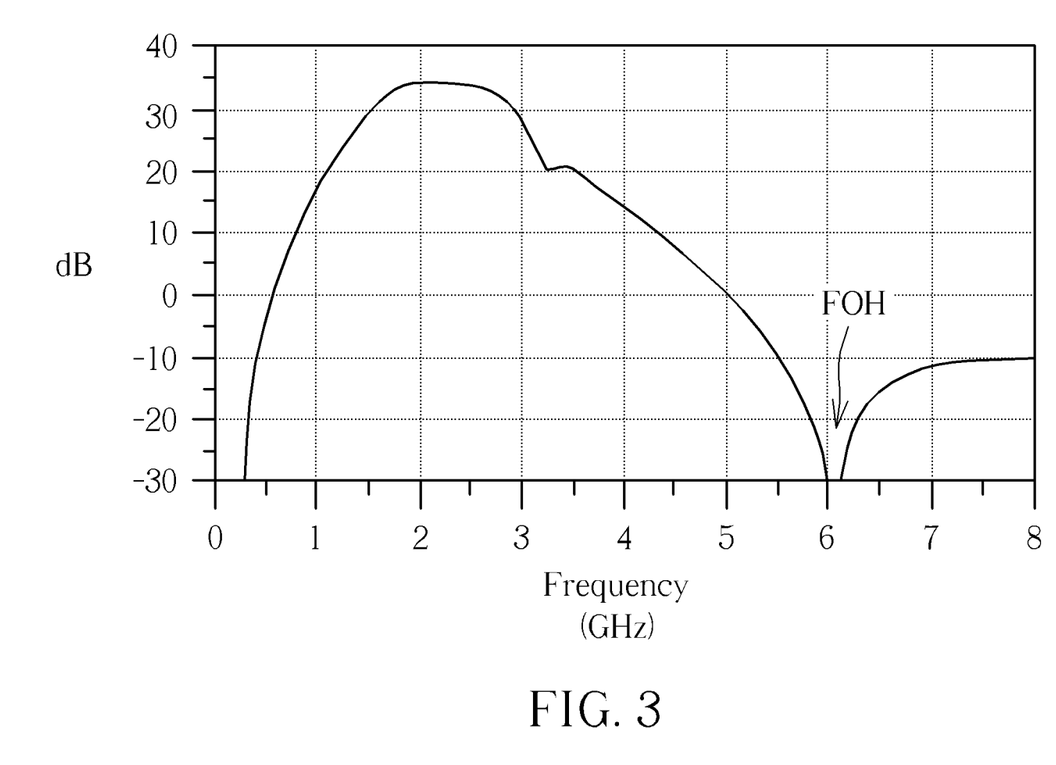
FIG. 3 is a diagram illustrating the second inductor and the first capacitor of the second matching unit generating the first open circuit resonance.
Figure 4:
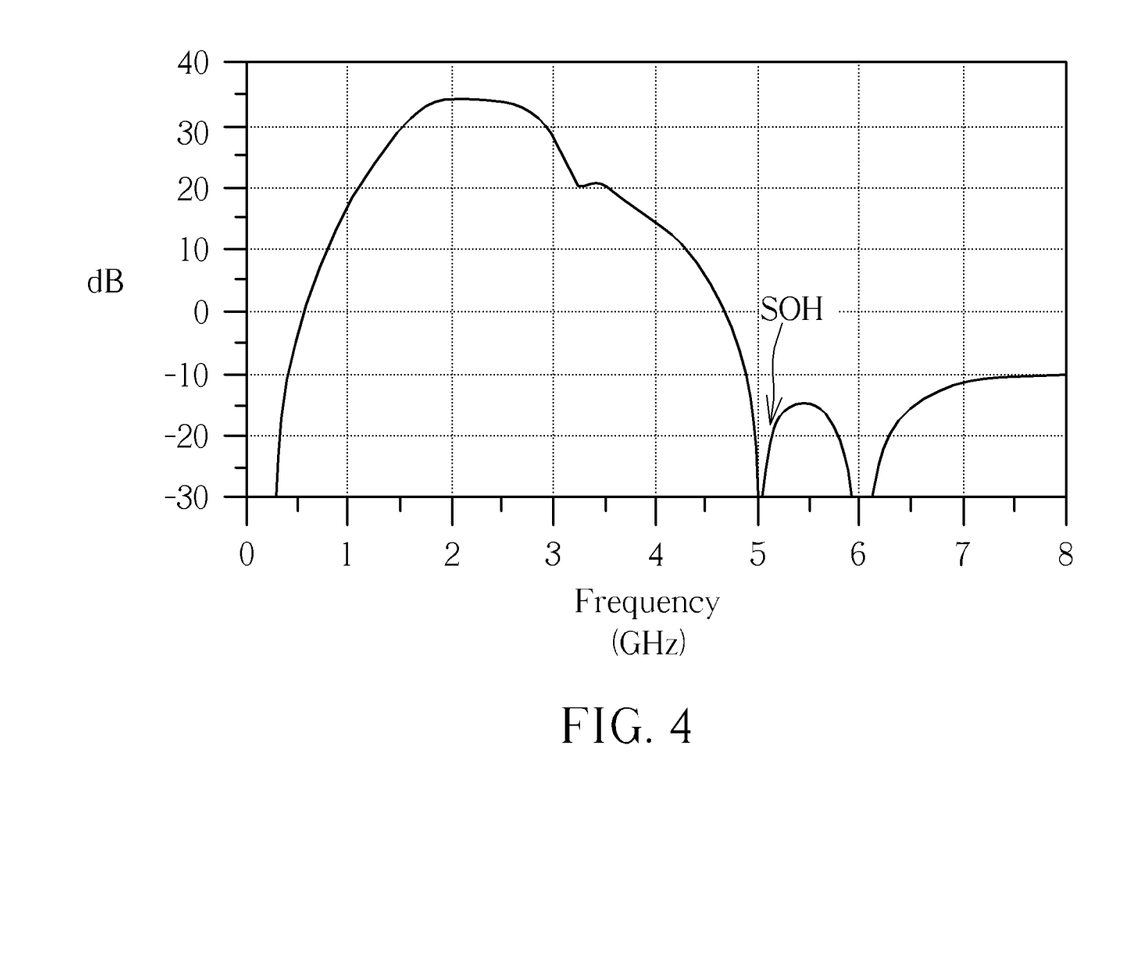
FIG. 4 is a diagram illustrating the third inductor and the second capacitor of the third matching unit generating the second open circuit resonance.

Please refer to FIG. 3 and FIG. 4. FIG. 3 is a diagram illustrating the second inductor 208 and the first capacitor 204 of the second matching unit 22 generating the first open circuit resonance FOH, and FIG. 4 is a diagram illustrating the third inductor 212 and the second capacitor 206 of the third matching unit 24 generating the second open circuit resonance SOH. As shown in FIG. 2, the first capacitor 204 of the second matching unit 22 and the first inductor 202 of the first matching unit 20 are used for matching an input impedance GammaL of the input stage circuit 216, and forming a low-pass filter to filter a high frequency component of the input signal IS. As shown in FIG. 2 and FIG. 3, the second inductor 208 and the first capacitor 204 are used for generating the first open circuit resonance FOH to partially suppress a second harmonic and a third harmonic of the input signal IS of the input stage circuit 216. The second inductor 208 and the first capacitor 204 can utilize equation (1) to generate the first open circuit resonance FOH:

$$FOH = \frac{1}{2\pi\sqrt{L1 \times C1}} \quad (1)$$

As shown in equation (1), L1 is an inductance of the second inductor 208 and C1 is a capacitance of the first capacitor 204. As shown in FIG. 3, because the first open circuit resonance FOH (6 GHz) is between the second harmonic (5 GHz) and the third harmonic (7.5 GHz) of the input signal IS, the first open circuit resonance FOH can partially suppress the second harmonic and the third harmonic of the input signal IS of the input stage circuit 216.

As shown in FIG. 4, the third inductor 212 and the second capacitor 206 are used for generating the second open circuit resonance SOH (5 GHz) to suppress the second harmonic (5 GHz) of the input signal IS. The third inductor 212 and the second capacitor 206 can utilize equation (2) to generate the second open circuit resonance SOH:

$$SOH = \frac{1}{2\pi\sqrt{L3 \times C2}} \quad (2)$$

As shown in equation (2), L3 is an inductance of the third inductor 212 and C2 is a capacitance of the second capacitor 206.

Because the first capacitor 204 and the first inductor 202 can match the input impedance GammaL of the input stage circuit 216 and filter the high frequency component of the input signal IS, the first open circuit resonance FOH generated by the second inductor 208 and the first capacitor 204 of the second matching unit 22 can partially suppress the second harmonic and the third harmonic of the input signal IS of the input stage circuit 216, and the second open circuit resonance SOH generated by the third inductor 212 and the second capacitor 206 can suppress the second harmonic of the input stage circuit 216. Power of the input signal IS (that is, power of a baseband signal of the input signal IS) can be transmitted to the output stage circuit 218 through the first inductor 202, the second capacitor 206, and the third capacitor 210.

Figure 5:
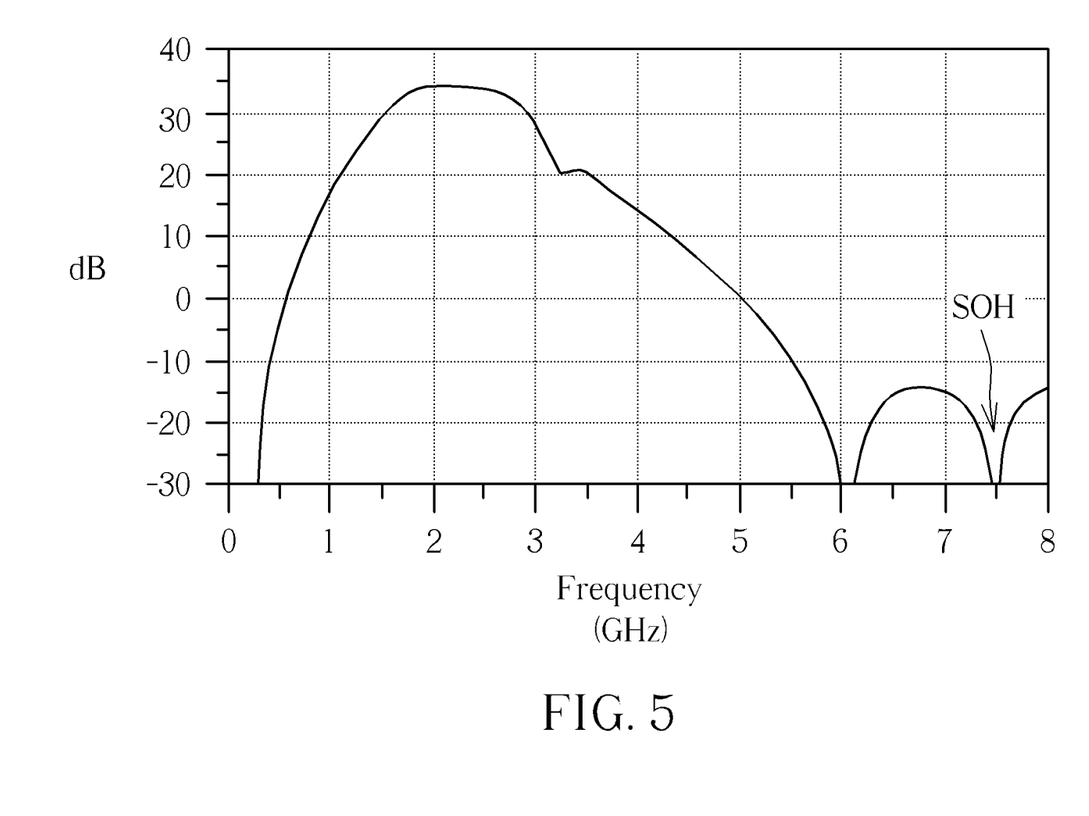
FIG. 5 is a diagram illustrating the third inductor and the second capacitor of the third matching unit generating the second open circuit resonance.

Please refer to FIG. 5. FIG. 5 is a diagram illustrating the third inductor 212 and the second capacitor 206 of the third matching unit 24 generating the second open circuit resonance SOH. As shown in FIG. 5, in another embodiment of the present invention, the second open circuit resonance SOH generated by the third inductor 212 and the second capacitor 206 is used for suppressing the third harmonic (7.5 GHz) of the input signal IS. Because the first capacitor 204 and the first inductor 202 can match the input impedance GammaL of the input stage circuit 216 and filter the high frequency component of the input signal IS, the first open circuit resonance FOH generated by the second inductor 208 and the first capacitor 204 of the second matching unit 22 can partially suppress the second harmonic and the third harmonic of the input signal IS of the input stage circuit 216, and the second open circuit resonance SOH generated by the third inductor 212 and the second capacitor 206 can suppress the third harmonic of the input signal IS of the input stage circuit 216. The power of the input signal IS (that is, the power of the baseband signal of the input signal IS) can be transmitted to the output stage circuit 218 through the first inductor 202, the second capacitor 206, and the third capacitor 210.

Figure 6:
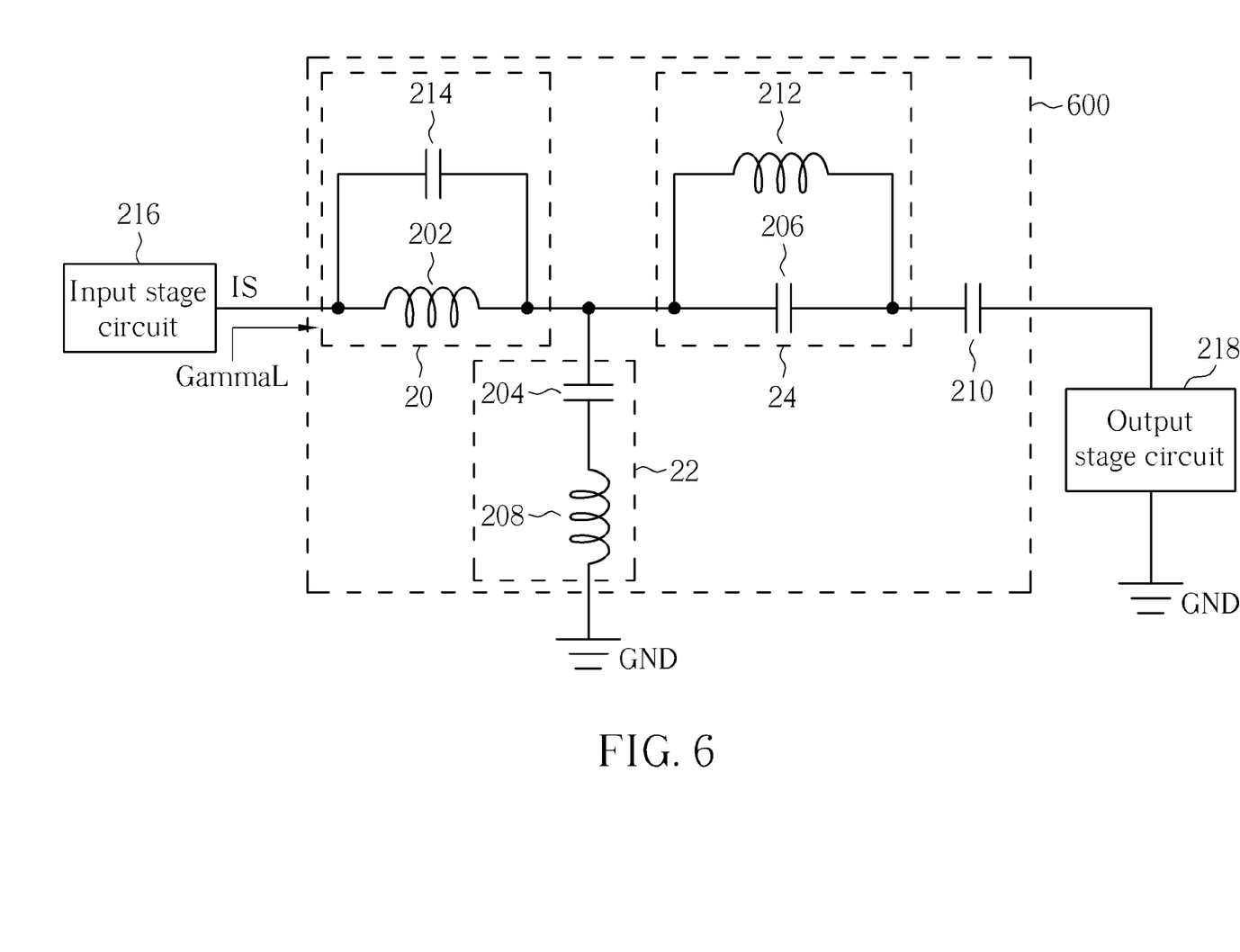
FIG. 6 is a diagram illustrating a matching circuit system according to another embodiment.
Figure 7:
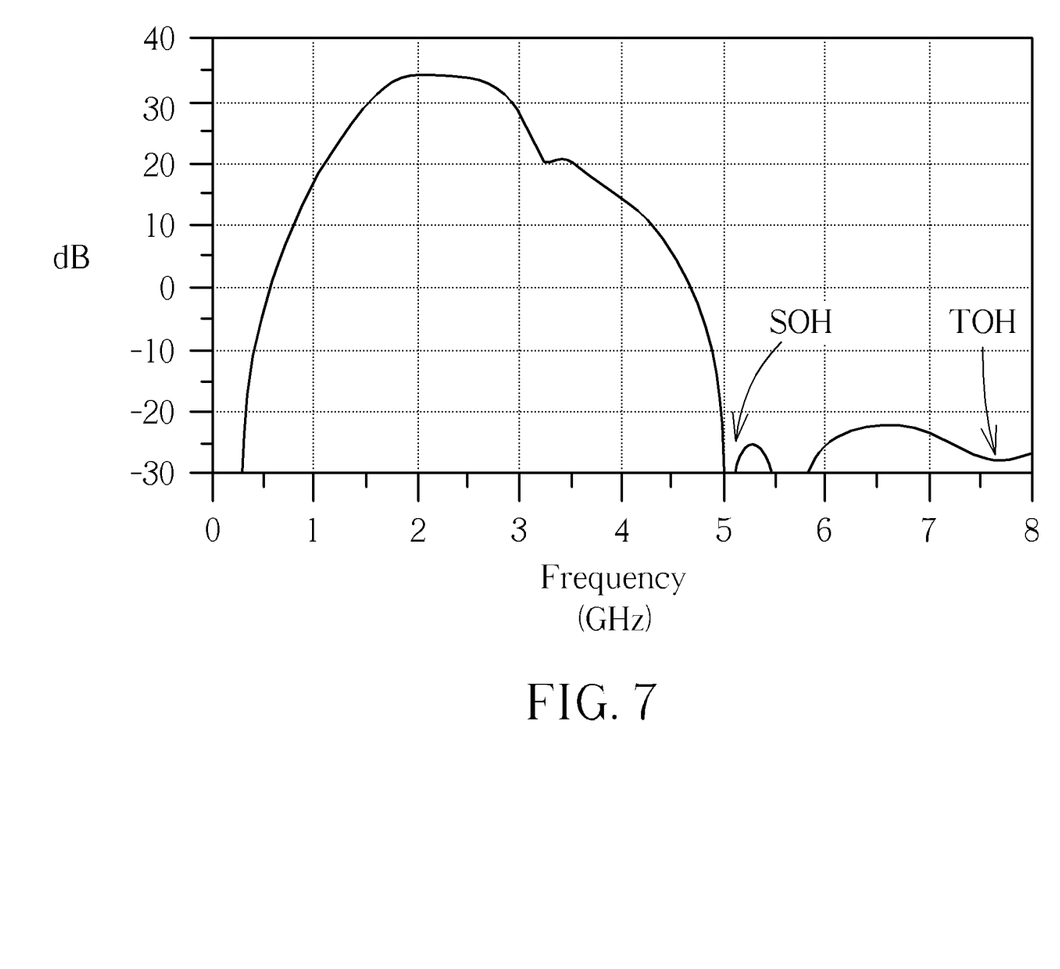
FIG. 7 is a diagram illustrating a second open circuit resonance generated by the third inductor and the second capacitor of the third matching unit, and a fourth capacitor and a third open circuit resonance generated by the first inductor of the first matching unit.

Please refer to FIG. 6 and FIG. 7. FIG. 6 is a diagram illustrating a matching circuit system 600 according to another embodiment, and FIG. 7 is a diagram illustrating a second open circuit resonance SOH generated by the third inductor 212 and the second capacitor 206 of the third matching unit 24, and a third open circuit resonance TOH generated by the first inductor 202 and a fourth capacitor 214 of the first matching unit 20. As shown in FIG. 6, a difference between the matching circuit system 600 and the matching circuit system 200 is that the first matching unit 20 of the matching circuit system 600 further includes the fourth capacitor 214, where a capacitance of the fourth capacitor 214 is related to the operation frequency of the input stage circuit 216. As shown in FIG. 6, the fourth capacitor 214 has a first terminal coupled to the second terminal of the first inductor 202, and a second terminal coupled to the first terminal of the first inductor 202. The fourth capacitor 214 and the first inductor 202 of the first matching unit 20 can utilize equation (3) to generate the third open circuit resonance TOH:

$$TOH = \frac{1}{2\pi\sqrt{L1 \times C4}} \quad (3)$$

Figure 8:
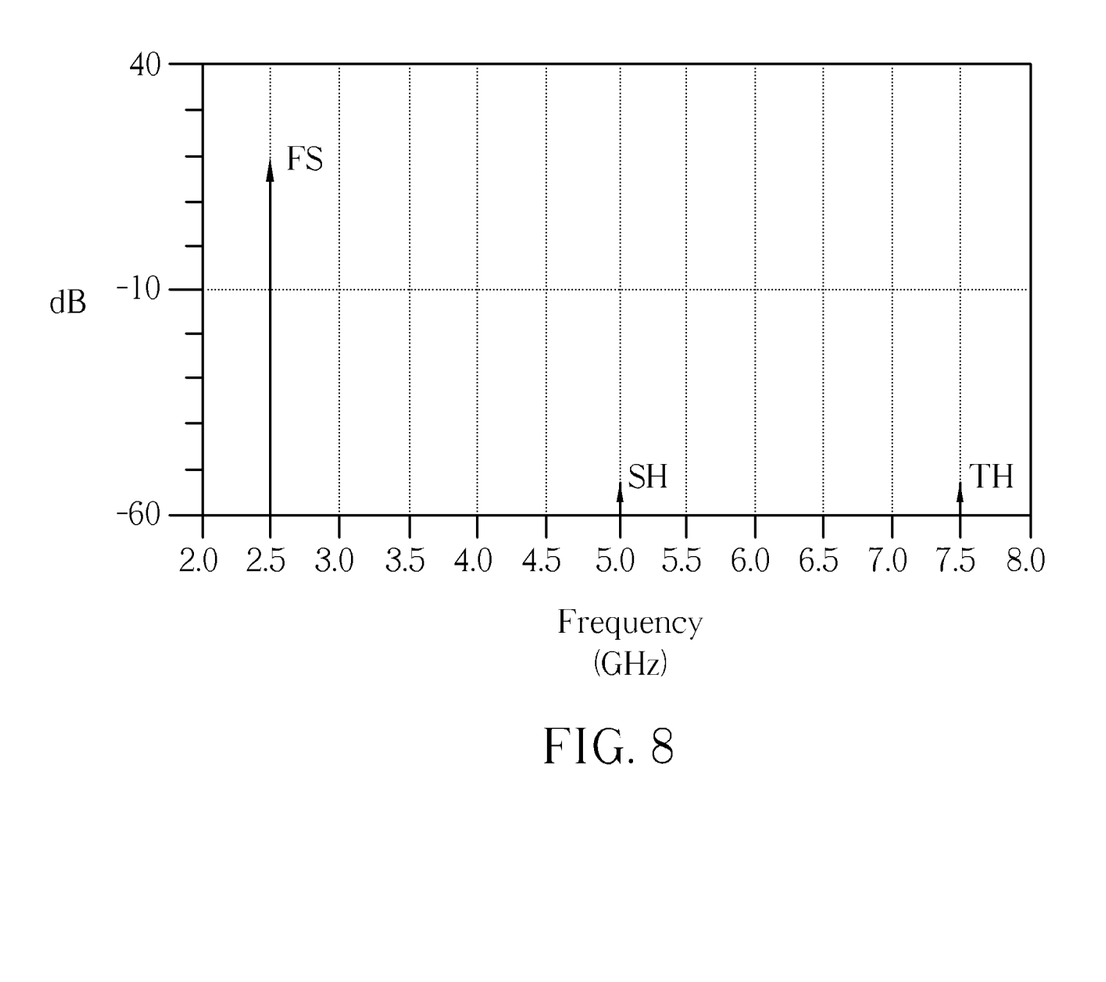
FIG. 8 is a diagram illustrating a signal received by the output stage circuit.

As shown in equation (3), L1 is an inductance of the first inductor 202 and C4 is a capacitance of the fourth capacitor 214. As shown in FIG. 7, when the second open circuit resonance SOH generated by the third inductor 212 and the second capacitor 206 of the third matching unit 24 is used for suppressing the second harmonic of the input signal IS, the third open circuit resonance TOH generated by the fourth capacitor 214 and the first inductor 202 of the first matching unit 20 is used for suppressing the third harmonic of the input signal IS. Please refer to FIG. 8. FIG. 8 is a diagram illustrating a signal received by the output stage circuit 218. As shown in FIG. 8, compared to a baseband signal FS of the input signal IS, the second harmonic SH and the third harmonic TH of the input signal IS are suppressed by the matching circuit system 600.

In addition, in another embodiment in FIG. 6, the second open circuit resonance SOH generated by the third inductor 212 and the second capacitor 206 of the third matching unit 24 is used for suppressing the third harmonic of the input signal IS, and the third open circuit resonance TOH generated by the fourth capacitor 214 and the first inductor 202 of the first matching unit 20 is used for suppressing the second harmonic of the input signal IS. Further, subsequent operational principles of the matching circuit system 600 are the same as those of the matching circuit system 200, so further description thereof is omitted for simplicity. In addition, in another embodiment in FIG. 6, the matching circuit system 600 further includes the input stage circuit 216. In addition, in another embodiment in FIG. 6, the matching circuit system 600 further includes the input stage circuit 216 and the output stage circuit 218.

Figure 9:
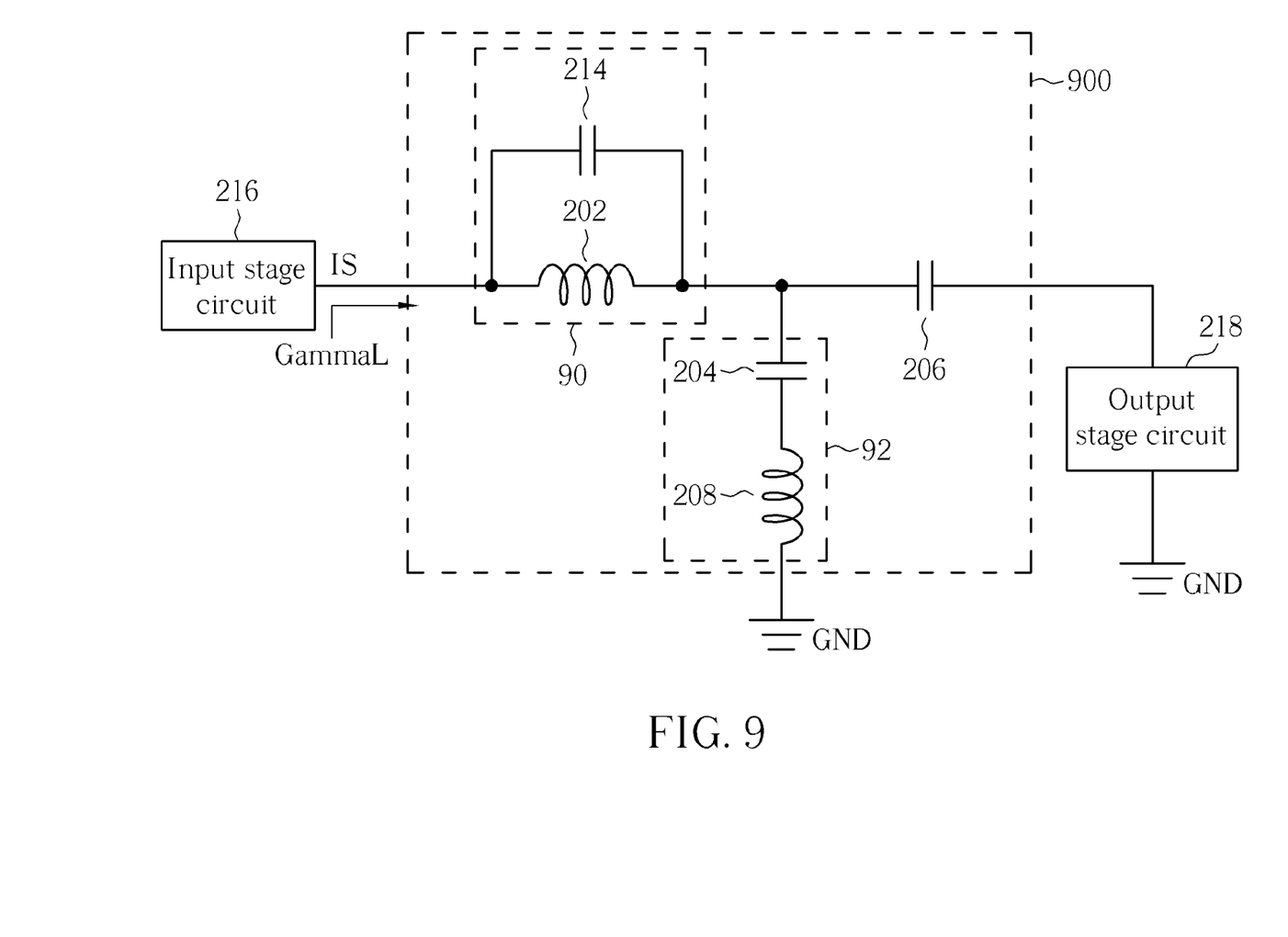
FIG. 9 is a diagram illustrating a matching circuit system according to another embodiment.

Please refer to FIG. 9. FIG. 9 is a diagram illustrating a matching circuit system 900 according to another embodiment. The matching circuit system 900 includes a first matching unit 90, and a second matching unit 92, where the second matching unit 92 is coupled between the first matching unit 90 and ground GND. As shown in FIG. 9, the first matching unit 90 includes a first inductor 202, and a fourth capacitor 214; and, the second matching unit 92 includes a first capacitor 204, and a second inductor 208. In addition, the matching circuit system 900 further includes a second capacitor 206. A capacitance of the fourth capacitor 214 is related to the operation frequency of the input stage circuit 216. As shown in FIG. 9, operational principles of the first inductor 202, the first capacitor 204, the second capacitor 206, the second inductor 208, the input stage circuit 216, and the output stage circuit 218 are the same as those of the first inductor 202, the first capacitor 204, the second capacitor 206, the second inductor 208, the input stage circuit 216, and the output stage circuit 218 of the matching circuit system 200, so further description thereof is omitted for simplicity. In addition, the fourth capacitor 214 and the first inductor 202 of the first matching unit 90 generate the third open circuit resonance TOH according to equation (3) to suppress the second harmonic (5 GHz) of the input signal IS. However, in another embodiment of the present invention, the third open circuit resonance SOH generated by the fourth capacitor 214 and the first inductor 202 of the first matching unit 90 is used for suppressing the third harmonic (7.5 GHz) of the input signal IS. Further, subsequent operational principles of the matching circuit system 900 are the same as those of the matching circuit system 200, so further description thereof is omitted for simplicity. In addition, in another embodiment in FIG. 9, the matching circuit system 900 further includes the input stage circuit 216. In addition, in another embodiment in FIG. 9, the matching circuit system 900 further includes the input stage circuit 216 and the output stage circuit 218.

To sum up, the matching circuit system utilizes the first capacitor and the second inductor of the second matching unit to partially suppress the second harmonic and the third harmonic of the input signal, and utilizes the first inductor of the first matching unit and the first capacitor of the second matching unit to match the input impedance of the input stage circuit and filter the high frequency component of the input signal. Then, the matching circuit system utilizes the second capacitor and the third inductor of the third matching unit, and the fourth capacitor and the first inductor of the first matching unit to suppress the second harmonic and the third harmonic of the input signal. Thus, compared to the prior art, the signal received by the output stage circuit has smaller harmonic distortion.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A matching circuit system, comprising:
    a first inductor having a first terminal, and a second terminal configured to receive an input signal;
    a first capacitor having a first terminal coupled to the first terminal of the first inductor, and a second terminal;
    a second inductor having a first terminal coupled to the second terminal of the first capacitor, and a second terminal coupled to ground;
    a second capacitor having a first terminal coupled to the first terminal of the first capacitor, and a second terminal;
    a third capacitor having a first terminal coupled to the second terminal of the second capacitor; and
    a third inductor having a first terminal coupled to the first terminal of the second capacitor, and a second terminal coupled to the second terminal of the second capacitor;
    wherein the first capacitor and the second inductor are used for generating a first open circuit resonance corresponding to a first frequency to partially suppress a second harmonic of the input signal corresponding to a second frequency and a third harmonic of the input signal corresponding to a third frequency, the second capacitor and the third inductor are used for generating a second open circuit resonance corresponding to the second frequency or the third frequency to suppress at least one of the second harmonic and the third harmonic of the input signal, and the first frequency is between the second frequency and the third frequency.

2. The matching circuit system of claim 1, further comprising:
    an output stage circuit having a first terminal coupled to the second terminal of the third capacitor, and a second terminal coupled to the ground.

3. The matching circuit system of claim 2, wherein the output stage circuit is an antenna having a 50Ω impedance.

4. The matching circuit system of claim 2, wherein the output stage circuit is a switch having a 50Ω impedance.

5. The matching circuit system of claim 1, further comprising:
- a fourth capacitor having a first terminal coupled to the second terminal of the first inductor, and a second terminal coupled to the first terminal of the first inductor;
- wherein the fourth capacitor and the first inductor are used for generating a third open circuit resonance to suppress at least another one of the second harmonic and the third harmonic of the input signal.

6. The matching circuit system of claim 5, further comprising:
- an output stage circuit having a first terminal coupled to the second terminal of the third capacitor, and a second terminal coupled to the ground.

7. The matching circuit system of claim 5, further comprising:
- an input stage circuit coupled to the second terminal of the first inductor.

8. The matching circuit system of claim 7, further comprising:
- an output stage circuit having a first terminal coupled to the second terminal of the third capacitor, and a second terminal coupled to the ground.

9. The matching circuit system of claim 1, further comprising:
- an input stage circuit coupled to the second terminal of the first inductor.

10. The matching circuit system of claim 9, further comprising:
- an output stage circuit having a first terminal coupled to the second terminal of the third capacitor, and a second terminal coupled to the ground.

11. The matching circuit system of claim 9, wherein the input stage circuit is a power amplifier.

12. The matching circuit system of claim 9, wherein the input stage circuit is an amplifier.

13. A matching circuit system, comprising:
- a first matching unit comprising:
  - a first inductor having a first terminal, and a second terminal configured to receive an input signal;
- a second matching unit coupled between the first matching unit and ground, wherein the second matching unit comprises:
  - a first capacitor having a first terminal coupled to the first terminal of the first inductor, and a second terminal; and
  - a second inductor having a first terminal coupled to the second terminal of the first capacitor, and a second terminal coupled to the ground; and
- a third matching unit coupled to the second matching unit and the first matching unit, wherein the third matching unit comprises:
  - a second capacitor having a first terminal coupled to the first terminal of the first capacitor, and a second terminal; and
  - a third inductor having a first terminal coupled to the first terminal of the second capacitor, and a second terminal coupled to the second terminal of the second capacitor;
- wherein the second matching unit is used for generating a first open circuit resonance corresponding to a first frequency to partially suppress a second harmonic of the input signal corresponding to a second frequency and a third harmonic of the input signal corresponding to a third frequency, the third matching unit is used for generating a second open circuit resonance corresponding to the second frequency or the third frequency to suppress at least one of the second harmonic and the third harmonic of the input signal, and the first frequency is between the second frequency and the third frequency.

14. The matching circuit system of claim 13, further comprising:
- an input stage circuit coupled to the second terminal of the first inductor.

15. The matching circuit system of claim 13, further comprising:
- a third capacitor having a first terminal coupled to the second terminal of the second capacitor.

16. The matching circuit system of claim 15, further comprising:
- an output stage circuit coupled between the second terminal of the third capacitor and the ground.

17. The matching circuit system of claim 16, further comprising:
- an input stage circuit coupled to the second terminal of the first inductor.

18. The matching circuit system of claim 15, wherein the first matching unit further comprises:
- a fourth capacitor having a first terminal coupled to the second terminal of the first inductor, and a second terminal coupled to the first terminal of the first inductor; and
- wherein the fourth capacitor and the first inductor are used for generating a third open circuit resonance to suppress at least another one of the second harmonic and the third harmonic of the input signal.

19. The matching circuit system of claim 18, further comprising:
- an input stage circuit coupled to the second terminal of the first inductor.

20. The matching circuit system of claim 18, further comprising:
- an output stage circuit coupled between the second terminal of the third capacitor and the ground.

21. The matching circuit system of claim 20, further comprising:
- an input stage circuit coupled to the second terminal of the first inductor.

* * * * *